United States Patent
Gross et al.

(10) Patent No.: US 6,310,352 B1
(45) Date of Patent: Oct. 30, 2001

(54) RADIATION DETECTION DEVICE

(75) Inventors: Karlheinz Gross; Wolfgang Maier-Borst, both of Dossenheim; Michael Klaus, Berlin; Hans-Hermann Schrenk, Zeiskam; Gerd Stehle, Heidelberg; Hannsjörg Sinn, Wiesloch, all of (DE)

(73) Assignee: Deutsches Krebsforschungszentrum Stiftung Des Offentlichen Rechts, Heidelberg (DE)

( * ) Notice: Subject to any disclaimer, the term of this patent is extended or adjusted under 35 U.S.C. 154(b) by 0 days.

(21) Appl. No.: 09/142,950

(22) PCT Filed: Mar. 18, 1997

(86) PCT No.: PCT/DE97/00564

§ 371 Date: Mar. 26, 1999

§ 102(e) Date: Mar. 26, 1999

(87) PCT Pub. No.: WO97/35171

PCT Pub. Date: Sep. 25, 1997

(30) Foreign Application Priority Data

Mar. 18, 1996 (DE) .............................................. 196 10 538

(51) Int. Cl.$^7$ ...................................................... G01J 1/58
(52) U.S. Cl. ................... 250/370.11; 250/483.1

(58) Field of Search ........................... 250/370.11, 458.1, 250/459.1, 483.1, 216; 385/12; 372/70

(56) References Cited

U.S. PATENT DOCUMENTS

| H1364 | * 10/1994 | Toeppen ................................... 372/6 |
| 5,302,025 | * 4/1994 | Kleinerman ........................... 374/131 |

* cited by examiner

*Primary Examiner*—Georgia Epps
*Assistant Examiner*—Richard Hanig
(74) *Attorney, Agent, or Firm*—Steven J. Hultquist; Marianne Fuierer

(57) ABSTRACT

The invention relates to a device for detecting input radiation such as X-rays, γ-rays, ionizing radiation or fluorescent and low-level light. The device has at least one detection element comprising a sensor component (scintillator) for converting the input radiation into photons (scintillation light) in the UV, visible or IR part of the electromagnetic spectrum and an optical amplifier component which receives the light converted by the sensor component, forwards it for further processing and amplifies it at the same time. According to the invention, the amplifier component comprises at least one optical waveguide (1, 2, 2a, 2b, 20) whose material is optically pumped to amplify the scintillation light (3, 24, 25).

27 Claims, 5 Drawing Sheets

RADIATION DETECTION DEVICE

The invention relates to a device for the detection of incident radiation, e.g. X-rays, γ-rays, ionizing radiation and fluorescence or low-level light, having at least one detecting element which has a sensor section (scintillator, wavelength shifter, and the like) for converting the incident radiation into photons in the UV, visible, or IR portions of the electromagnetic spectrum (e.g., scintillation light) and an optical amplifier section that receives the converted light from the detector section, transmits it for further processing, and amplifies it in the process.

Devices and detectors for detection of incident radiation from the wavelength spectrum of X-rays and γ-rays are known in many embodiments. These devices have achieved great importance in the field of medicine, particularly in connection with imaging processes such as PET (positron emission tomography), SPECT (single photon emission computed tomography), scintigraphy (Anger camera), and X-ray CT (computed tomography).

Among the various imaging processes in medicine, MR (magnetic resonance or nuclear magnetic resonance) tomography has great diagnostic importance based on superior image quality and three-dimensional image information. This is based on the measurement of the three-dimensional distribution of hydrogen atoms. It is orders of magnitude better than other radiation or nuclear medicine processes such as scintigraphy and PET in terms of resolution. For these reasons MR tomography is particularly suitable for diagnostic localization. In contrast, the strengths of scintigraphy or PET are in the areas of detection of physiological parameters.

There thus exists a need for a medical instrument that appropriately combines the advantages of imaging processes based on physiological parameters, e.g. scintigraphy/PET, with those of imaging processes based on structural information, as for example MR tomography.

Attempts to combine information from the two systems after the fact have been made at the Deutsche Krebsforschungszentrum [German Cancer Research Center] among other places (L. R. Schad, "Three Dimensional Image Correlation of CT, MR and PET: Studies in Radiotherapy Treatment Planning of Brain Tumors", Journal of Computer assisted Tomography, 1987, II (6), p. 948–954).

However, a difficulty in the later combination of information from multiple different imaging systems is that the human body is not rigid. Conversion problems thus arise among the various imaging systems. Attempts are made to compensate for these problems through digital image processing, an effort which succeeds for tumors in the cranial region through stereotactic methods.

A combination device that permits the simultaneous acquisition of structural information and the three-dimensional distribution of radioactivity would be desirable. This is not achievable through a combination of currently available devices. The primary obstacles in this regard are the high static magnetic field, the time-switched strong magnetic field gradients, the pulsed incident electromagnetic waves in the MHz region and the scarcity of available space for additional detection devices in the central area of an MR tomograph. For this reason, electronic detectors cannot be used inside an MR tomograph. This means that the crystals currently used in PET devices (BGO, $BaF_2$ and the like) that are directly coupled to a photomultiplier are unsuitable for the desired combination device.

These problems can be at least partially overcome by the use of bundles of scintillating optical waveguides instead of crystals. Initial tests of bundled scintillating optical waveguides have already been published (R. C. Chaney et al, "Testing the Spatial Resolution and Efficiency of Scintillating Fiber PET Modules", IEEE Transactions of Nuclear Science, Vol. 39 No. 5, October 1992). In a seminar presentation given at the German Cancer Research Center in the summer of 1995, Professor P. P. Antich reported on the first tests of a combination device (PET/MR tomography). Scintillating plastic optical waveguides were used in these instruments. The scintillation light exiting the end of the fiber bundle was converted into an electrical signal with photomultipliers (the distance between the scintillation light and photomultiplier was approximately 5 m here). In these experiments, great problems were presented by the not to be neglected optical attenuation of the scintillating plastic fibers as well as the small number of photons generated in the scintillating optical waveguides. The invention solves precisely these problems in an elegant fashion, as is described in detail below.

As an alternative to photomultipliers, MCPs (multichannel plates, multichannel plate amplifiers) are used to detect weak optical signals. A disadvantage of both systems is that high voltages in the range of several hundred volts are required for their operation. This increases the cost of devices equipped with such detectors.

Electronic components are also used for detection of X-rays and γ-quanta. These are primarily PIN and avalanche diodes, which exhibit a pronounced thermal noise characteristic and for this reason alone are inherently inferior to optical amplifiers.

Optical amplifiers are inherently superior to electronic amplifiers for physical reasons because they have a better signal-to-noise ratio.

In summary, it can be said with regard to the above-described state of the art that the amplifier sections of known radiation detectors are only conditionally suited for amplifying very weak signals and transmitting these signals over large distances. A further disadvantage of the known devices is that very weak scintillation or fluorescence light is only detectable with difficulty, especially in hard-to-reach experimental or investigative arrangements. Moreover, a spatial separation between the place of detection and the place of analysis is achievable only with difficulty on account of the weak signals.

Reference is made to the following publications regarding the general state of the art:

DE-OS 23 51 450; this publication relates to a scintigraphic collimator that serves to focus the γ-rays emerging from a γ-ray-emitting experimental object.

DE-OS 24 46 226; this publication relates to a scintillator that consists of metal-ion-doped alkali halogenide material.

DE 39 18 843; this publication relates to an X-ray detector that consists of a series of small rods of scintillator material.

DE 33 27 031 A1; this publication relates to an X-ray device in which a slot-shaped X-ray image is converted into a visible image and delivered via an optical waveguide arrangement to an image intensifier whose output image is translated into an electrical signal by a converter.

DE 43 34 594; this publication relates to a detector for high-energy radiation for computer tomography, wherein is provided a series of scintillators which are associated with corresponding optical waveguides that are separated from one another by slits.

EP 0 471 926 A2; this publication relates to a fast, radiation-stable CT-scintillation system in which a special garnet material is used.

The objective of the present invention is to create a radiation detector which can be used for imaging processes that have high spatial resolution even for weak incident radiation and especially in combination with difficult-to-reach arrangements.

Advantageous further refinements of the invention are presented in the subsidiary claims. Advantageous applications of the device in accordance with the invention are named in the application claims.

Thus in other words, the invention creates a radiation detector with a detecting element whose amplifier section ensures optical amplification of scintillation light in the manner of a laser by means of an optical waveguide whose material is optically pumped. Through the optical pumping, the photons obtained by the sensor section from the incident radiation are amplified several thousand times. A crucial advantage of the device in accordance with the invention is that the optical waveguide, and thus the amplifier section, can be located in the immediate vicinity of the photon generating location or also in the vicinity of an optical guide that conveys these photons to the amplifier section. While even the weakest incident radiation or incident radiation in difficult-to-reach arrangements can be detected in the first case, where the optical waveguide is located in the immediate vicinity of the photon generation point, the primary advantage of the second case where the pumped optical waveguide is located distant from the photon generation point is that the photon amplification can take place undisturbed by interfering fields such as large magnetic fields.

Of special importance for the invention is the fact that an optical amplification takes place directly at the point of interaction of generated photons or if necessary through intermediate stages. This makes it possible to detect very small numbers of photons. The detector element thus provides a very compact, directional, high-efficiency component that additionally makes it possible to transmit information over long distances and to obtain the energy needed for amplification (pumping light in purely optical form) over long distances as well. In this way there is a spatial and functional division among the sections responsible for the conversion (e.g., $\gamma$-quantum$\rightarrow$v-photon$\rightarrow$amplification$\rightarrow$transmission$\rightarrow$electrical signal).

The sensor section and optical amplifier section each operate without electronic components. That is to say, (electrical) energy is supplied not through wires, but purely optically, which is a decisive advantage over existing silicon-based $\gamma$- and X-ray detectors. Thus, distances of several meters to hundreds of meters can separate the peripherally located electronic assemblies, e.g. the readout section (for example a CCD camera with a computer interface), the pumping light source (for example a laser diode that is required for generating the population inversion in the optical amplifier section) on the one side, from the purely optical section on the other side with the sensor section responsible for conversion of the X-ray or $\gamma$-quanta and the optical amplifier section.

The special optical waveguides required for the invention are already available and/or can be manufactured to customer requirements (Le Verre fluore). Preferred in this context are heavy metal fluoride glasses (HMFG, halide glasses), where they are doped with atoms from the lanthanide group of the Periodic Table (rare earth metals or rare earths). The lanthanide group includes: cerium (Ce), praseodymium (Pr), neodymium (Ne) [sic], promethium (Pm), samarium (Sm), europium (Eu), gadolinium (Ga) [sic], terbium (Tb), dysprosium (Dy), holmium (Ho), erbium (Er), thulium (Tm), ytterbium (Yb) and lutetium (Lu). Proof of laser activity has been demonstrated for the following rare earth metals in heavy metal fluoride glasses (status as of 1991; source: Fluoride Glass Fiber Optics, Ishar D. Aggarwal, Gand Lu, Academic Press, Inc., 1991): Nd, Er, Ho, Tm. In the meantime, laser activity has been demonstrated for nearly all rare earth metals. Additional preferred optical waveguides include glass ceramic material, chalcogenide glasses and phosphate glasses.

The above-mentioned glasses, particularly the heavy metal fluoride glasses, are multiple component glasses.

One of the advantages over doped silicate glasses is that significantly higher doping concentrations can be achieved with rare earth metals, which results in higher efficiency for optical amplifiers and fiber lasers.

A further advantage of heavy metal fluoride glasses doped with rare earth metals is that this material, unlike conventional silicate glass optical waveguides, exhibits crystal-like characteristics. Heavy metal fluoride glasses consist of materials such as $BaF_2$, CeF, for example, that are already used in crystalline form as radiation detectors. It is advantageous that heavy metal fluoride glasses have a high density that is sufficient to achieve the necessary stopping power (dE/dx; energy loss E per distance x) for $\gamma$-rays. This stopping power is not achievable with the plastic fibers that are common to date in this area and in high-energy physics. A further advantage arising from the use of heavy metal fluoride glass as an optical waveguide is that these optical waveguides can themselves function as collimators. An advantage of the heavy metal fluoride glasses over crystals for radiation detection resides in their simple handling, their easy workability, and their inexpensive manufacture.

In accordance with an advantageous refinement of the invention, direct population inversion through light at the pump wavelength $\lambda_1$ is not used; rather, a physical up-conversion process, or a variant thereof known as avalanche conversion is used. The long fluorescence lifetime of rare earth ions in heavy metal fluoride glasses benefits optical frequency up-conversion. In this process, a rare earth ion is first raised to a long-lived intermediate excitation state, from which it reaches a still higher state in a second step.

The pumped optical waveguide used in accordance with the invention for amplification of the scintillation light can take many forms. The optical waveguide is advantageously formed as an optical fiber, which is preferably enclosed by a jacket in a manner known per se. Injection of the pump light into the fiber is done either directly into the core of the fiber or into the inner region of the fiber jacket. The fiber jacket preferably consists of scintillating material and thereby forms the sensor part of the detection device.

In accordance with an advantageous refinement of the invention, pulsed pumping light can be used in addition to continuous pumping light so that the optical amplifier can be time-triggered or activated. By this means, coordinated processes can be better observed. An application in cardiac scintigraphy (myocardial scintigraphy) may be considered an example of this. Thus the optical amplifier can be switched on at certain phases of heart action through simultaneous derivation from the electrocardiogram, where the switch-on phases can reach the picosecond range. This technique can be used for compensation of movement artifacts that are caused by breathing or circulation, for example.

In addition to single images, time series can also be detected by periodic pulsed activation. This is advantageous for kinetic investigation of heart function and, for example, for imaging of scar tissue after myocardial infarction.

The optical waveguide provided in accordance with the invention can also take the form of a columnar microstructure, that is grown, for example, on a silicon wafer. In addition to the columnar form, other forms for the microstructure elements that are suitable for the particular application purpose may be considered. Planar waveguides are likewise suitable for special applications.

As explained above, photon-emitting substances in the optical waveguide that come into consideration include rare earth metals, for instance. As an alternative, dye molecules can be used as the dopant.

A preferred area of application for the device in accordance with the invention lies in the area of radioimmunoassays, in which β-radiation is evaluated. β-Radiation has only a very short range. Active amplifier elements on the basis of the pumped optical waveguide in accordance with the invention, for instance in the form of fiber bundles or in the form of columnar microstructures on a silicon wafer (or a gallium arsenide substrate on which laser diodes and photodiodes for detection are implemented together) can serve in this application as micro-scintillators and micro-amplifiers of scintillation light produced by β-radiation. A special advantage of this application is that these elements can serve as a substitute for normal filler material. A very high resolution capability in the detection of β-radiation is achievable through an arrangement of this nature. Also of advantage is the reusability of the arrangement, as well as its convenient use, since the evaluation can proceed in a manner similar to that for film material.

An additional preferred application of the device in accordance with the invention lies in the area of biosensors. As an example an application from the field of molecular biology where fluorescence light is to be amplified will be described briefly here. In this process, antibodies are coupled to a light-amplifying fiber or a planar waveguide of light-amplifying material in accordance with the present invention. For this purpose a part of the outer jacket or the outer layer of the waveguide is preferably made porous by etching. The antigen is loaded with a fluorescence molecule. A part of the fluorescence light of a single dye molecule excited from inside or outside penetrates the active structure element (the light-amplifying fiber or the active planar waveguide) and is locally amplified there. The locally amplified fluorescence light can then be transmitted without loss to a spatially distant evaluation system. The particular advantage of this arrangement is that the location of amplification can be selected to be distant from the location of evaluation.

In summary, the present invention offers advantages including the following:

Even the weakest signals can be acquired and transmitted over large distances if necessary by means of the amplification in accordance with the invention.

Even very weak scintillation or fluorescence light can be detected in arrangements that are inaccessible or only accessible with difficulty using conventional detectors.

Incident radiation can be locally detected, amplified, and transmitted to a distant evaluation system, for example a CCD camera.

It is possible to achieve the physical separation of the point of conversion from γ- or X-ray quanta into light quanta with simultaneous amplification by optical pumping as well as by later conversion of the optical signal into an electrical signal.

The radiation detection device in accordance with the invention can be manufactured inexpensively.

The invention is described in greater exemplary detail below with the aid of the drawing; shown in:

Figure 1:
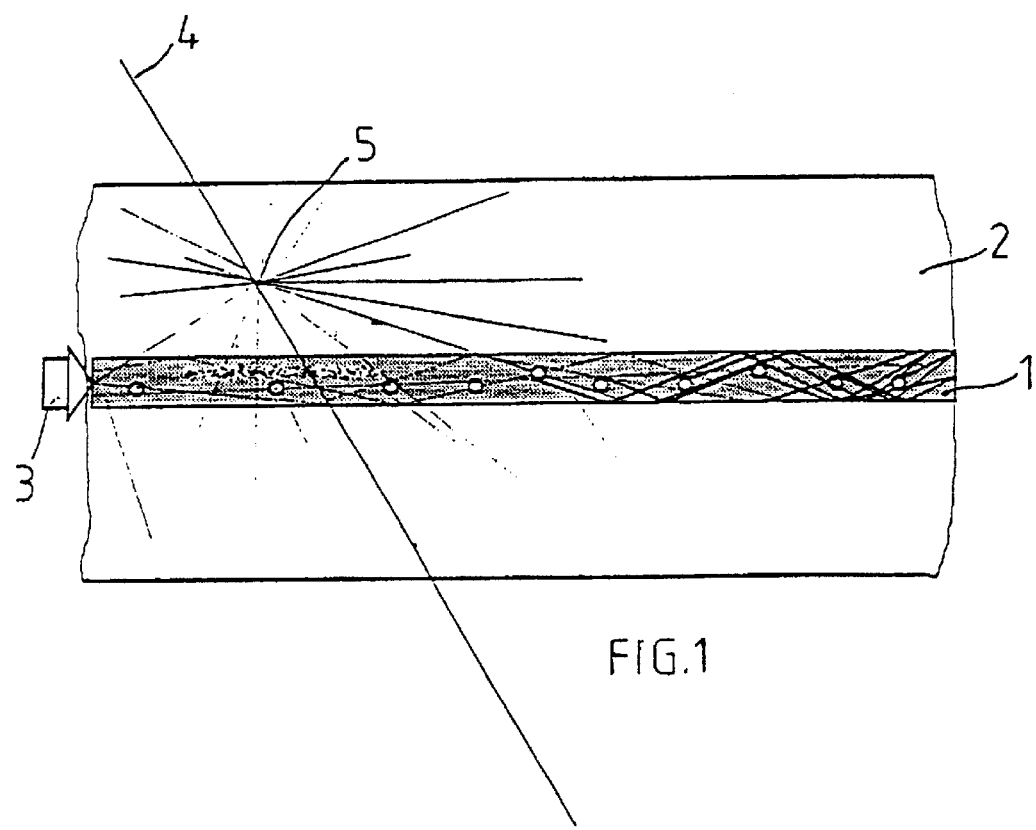
FIG. 1 is a schematic representation of a first embodiment of the detecting unit of the radiation detection device in accordance with the invention.

All detecting units shown in the drawing have integrated construction of sensor section and amplifier section.

FIG. 1 shows a first embodiment of the detecting element of the device for detecting incident radiation in accordance with the invention. The detecting element is an optical fiber amplifier consisting of a fiber core 1 and a jacket (cladding) 2 that surrounds the fiber core. The core 1 forms the amplifying section and consists of an optically active material that is optically pumped as shown by an arrow 3 which indicates the direction of injection of pumping light. The jacket 2 consists of a scintillating material which has a lower optical index of refraction than the fiber core 1.

Preferred as the material for the core 1 is a heavy metal fluoride glass, which in contrast to conventional silicate glass used for fibers, has crystal-like properties. The jacket 2 preferably also consists of a heavy metal fluoride glass, which however is doped with a dopant capable of scintillation. The preferred dopants are rare earth metals, particularly Ce, Nd, Pr, Er, Tm. Since heavy metal fluoride glass has a high density, an adequately large stopping power for γ-rays can be achieved; i.e. an optical waveguide constructed of this material is suitable for detecting not only low-energy radiation, but also high-energy radiation such as γ-rays, for which reason it is preferred for use in accordance with the invention.

Optically active centers of the pumped core material are schematically shown inside the fiber core 1 by means of small circles.

To illustrate the method of operation of the device in accordance with the invention, FIG. 1 shows the path 4 of an ionizing particle or a gamma-quantum that penetrates the optical fiber amplifier and generates scintillation light by interacting with the dopant in the jacket 2, as shown in FIG. 1 at the location 5 of the jacket 2, from which scintillation light is isotopically emitted. A part of the scintillation light and/or the photons from interaction point 5 enters the fiber core and is multiplied through the optical amplification process that takes place there (assuming suitable frequency). In particular, the pumping light injected into the core 1 creates a population inversion there; the photons radiated from scintillation which likewise enter the core 1 trigger stimulated emission from the optically active centers and are thereby amplified within the core. They are coupled out of the core 1 at a suitable point for further processing.

Materials considered for the jacket 2 also in principle include suitable scintillating plastics, which are is extensively described in the scientific literature. Plastic material of this type finds broad application especially from high-energy physics to medical applications. A disadvantage of using scintillating plastics is that the Compton effect dominates in interactions with γ- or X-rays: in other words, the energy of the gamma-quantum or X-ray quantum is only partially absorbed and the direction of the incident gamma quantum radiation is changed. A further disadvantage of this plastic material is its low average absorption (stopping power) for the incident radiation resulting from the low density of this material, as a result of which the efficiency for photon generation is poor. Lastly, this material has high internal damping, as a result of which the generated scintillation light can only be transmitted over short distances. These disadvantages of scintillating plastic are partially compensated for in the novel application of an optical fiber amplifier by the optical amplification, for which reason it can in principle be considered for use with the radiation detector in accordance with the invention.

Alternatively, a plastic fiber core doped with dye molecules that is surrounded by a scintillating jacket can serve as an optical amplifier.

The length of the fiber 1, 2 depends on the purpose of the application and is preferably between 5 mm and 5 m.

An advantage of the optically pumped optical waveguide 1, 2 embodied as optical fibers lies in the high optical amplification that can be achieved, in the extremely compact construction which also permits use in arrangements that are not accessible by conventional detectors, and in the economical manufacturability.

However the invention is not limited to optical fibers. Rather, crystals or planar optical waveguides manufactured from a material suitable for optical amplification may also be considered. Finally, a number of such detecting elements or fibers can be combined.

Figure 2:
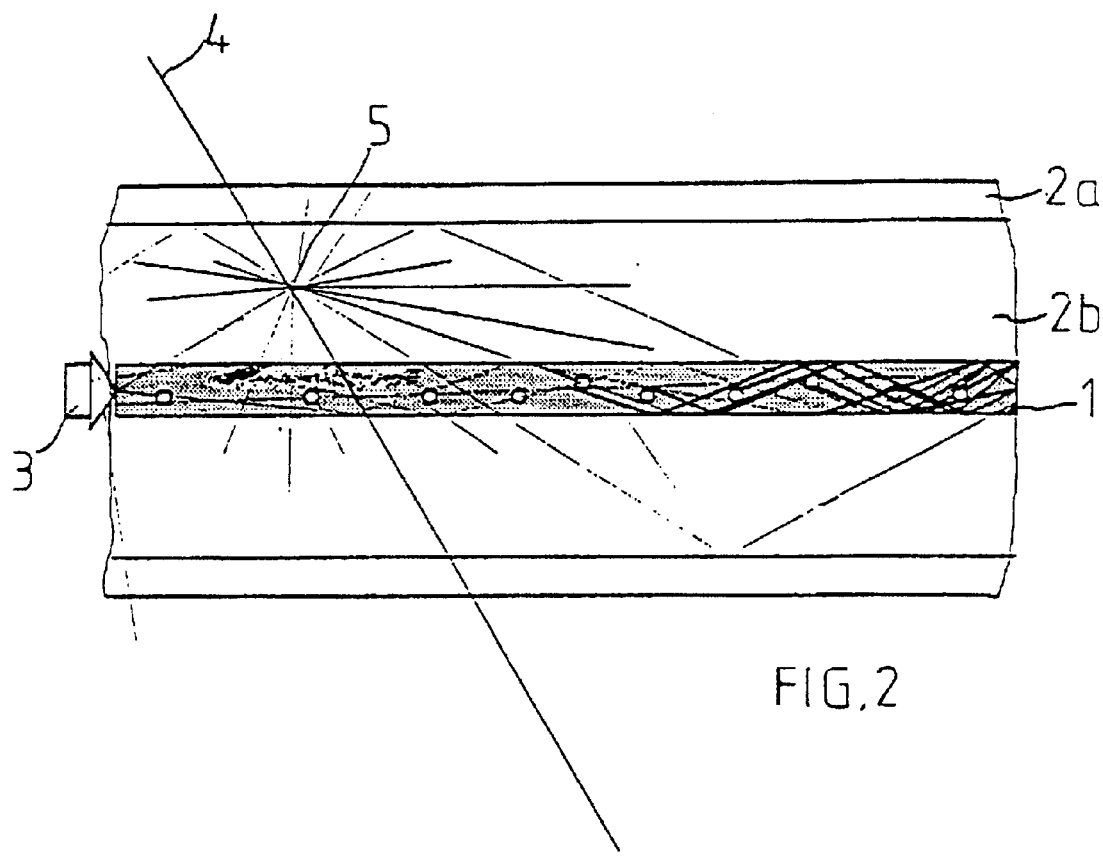
FIG. 2 is a second embodiment of the detecting unit of the radiation detection device in accordance with the invention.

A second embodiment of the detecting element of the device in accordance with the invention is shown in FIG. 2. This embodiment differs from the first embodiment shown in FIG. 1 through the use of a double jacket (double cladding) 2a, 2b. The construction of the inner jacket 2a corresponds to the construction of the jacket 2 of the embodiment in FIG. 1, and hence consists of a scintillating fiber material while the outer fiber jacket 2a can consist of a conventional non-scintillating fiber material with an index of refraction differing from that of the inner fiber jacket 2b in such a way that light generated by scintillation in the inner fiber jacket 2b is reflected at the boundary layer between fiber jacket 2a and fiber jacket 2b. The advantage of this measure is that this reflected light, which is not available for the amplification process in the embodiment in accordance with FIG. 1, is likewise fed into the amplification process.

Figure 3:
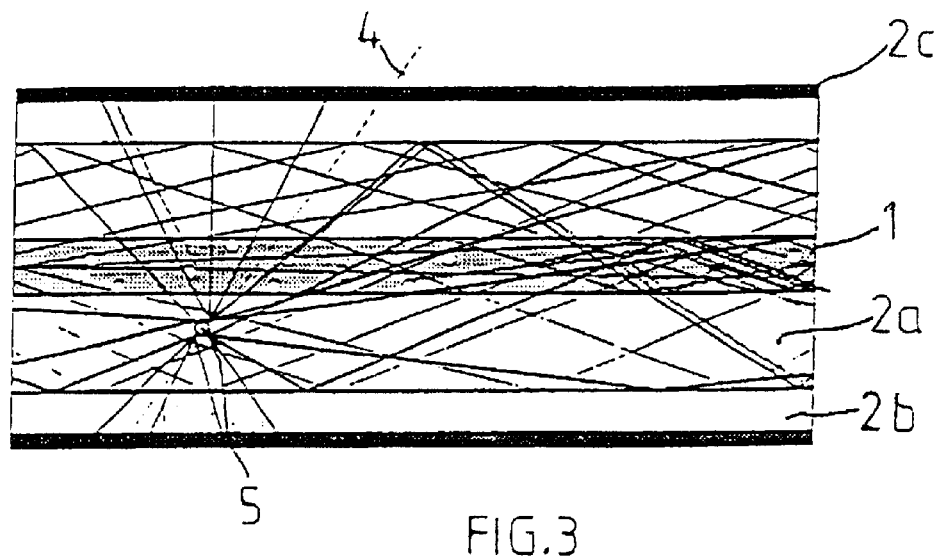
FIG. 3 is a third embodiment of the detecting unit of the radiation detection device in accordance with the invention.

FIG. 3 shows a third embodiment of the fiber-shaped detection material, which differs from the embodiment in FIG. 2 in that the pumping light is not coupled into the fiber core 1, but rather into the inner fiber jacket 2a. The advantage of this embodiment resides in a more favorable guiding of the pumping light as compared to the previous embodiments. Moreover, the optical fiber has as its outermost layer an opaque fiber sheath 2c, which prevents optical crosstalk with the neighboring fibers (optical isolation).

Figure 4:
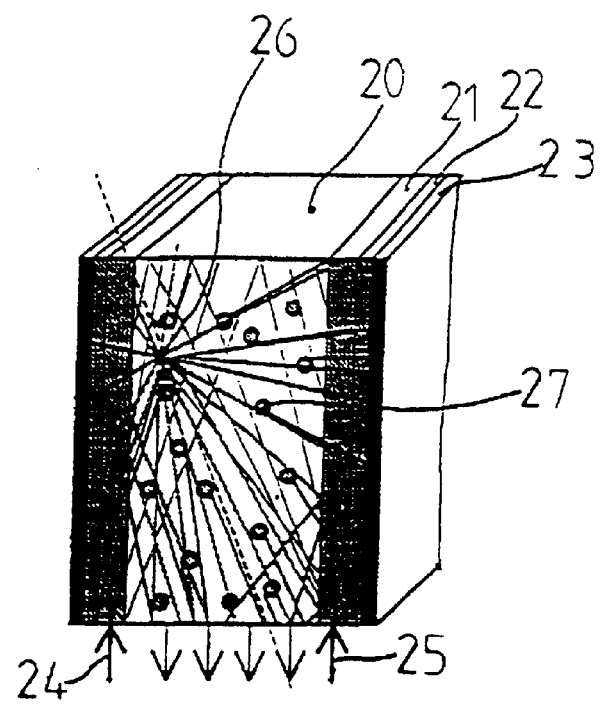
FIG. 4 is a fourth embodiment of the detecting unit of the radiation detection device in accordance with the invention.

FIG. 4 shows a fourth embodiment of the detecting element of the radiation detector in accordance with the invention. The optically active amplifier section in this embodiment is [formed] by an inorganic scintillating crystal (such as BGO) that is doped with laser-active rare earth metals. Thus the crystal simulaneously constitutes an active laser medium and a scintillation medium. Used as an example is a crystal (such as Nd—BGO) doped with rare earth metal ions. The BGO crystal 20, which in the embodiment shown has the shape of a rectangular prism, has a similar structure as in FIG. 3. The outermost opaque layer 23 provides optical isolation from the neighboring element. The layers 21 and 22 correspond to the inner (2a) and outer (2b) jacket material of FIG. 3. They serve as an optical transport element to couple pumping light into the BGO crystal. The jacket material can consist of transparent plastics. Pumping light is coupled into layers 21 and 22 as shown by arrows 24 and 25 in order to pump the BGO crystal and thereby amplify scintillation light generated by an incident light quantum, for example a gamma-quantum, in the BGO crystal at position 26 in the crystal material. The optically active centers are once again indicated with circles 27. An advantage of this embodiment of the detecting element is that costly photomultipliers can be dispensed with. Instead, inexpensive PIN or avalanche diodes can be used due to the preamplification in the optical amplifier section.

Figure 5:
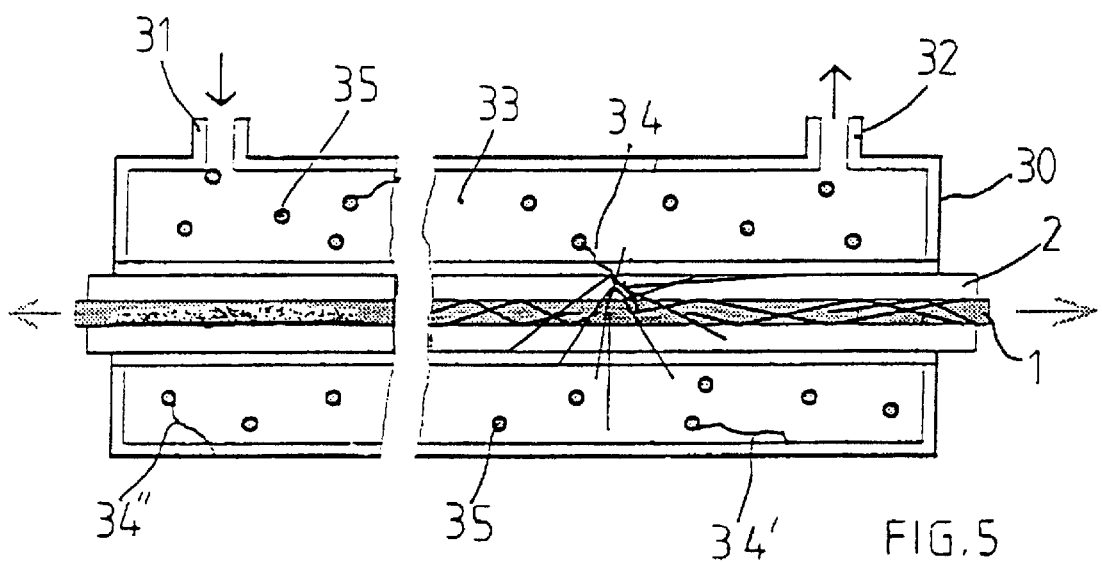
FIG. 5 is a special application of the detecting unit of the radiation detection device in accordance with the invention for detection of γ-radiation.

FIG. 5 shows a preferred application of the radiation detector in accordance with the invention with the embodiments of FIGS. 1 through 3 in the shape of an optical fiber amplifier for detecting particles. Accordingly the fiber 1, 2 passes through the center of an elongated container 30 with an inlet 31 and an outlet 32 for a carrier fluid 33 which flows around the fiber 1, 2 and contains radioactively marked molecules 35 or, for example, marked cells 35, marked bacteria 35, or marked viruses 35, that emit β-particles 34. The β-particles can now penetrate the fiber jacket 2 of scintillating material and produce scintillation light, which is amplified by the optical fiber amplifier in accordance with the invention as described above. The first advantage of the device in FIG. 5 is that the emitted β-particles are located in the immediate vicinity of the fiber amplifier. This is important because β-particles have only a short range (a few millimeters). The second advantage of the device is that the tubular structure can have any desired length so that the detection surface becomes large in relation to the fluid volume and the sensitivity increases. The third advantage of the device is that an interaction in the fiber core can be spatially associated with the volume element. This is accomplished by measuring and comparing the amplified light exiting the fiber core 1 to the right and to the left. This results in the opportunity to sort such things as molecules, cells, bacteria or viruses. The fourth advantage is that the device can be continuously operated as a flow-through detector. This permits the monitoring of minute quantities of radioactive beta rays, for example in waste water.

Figure 6:
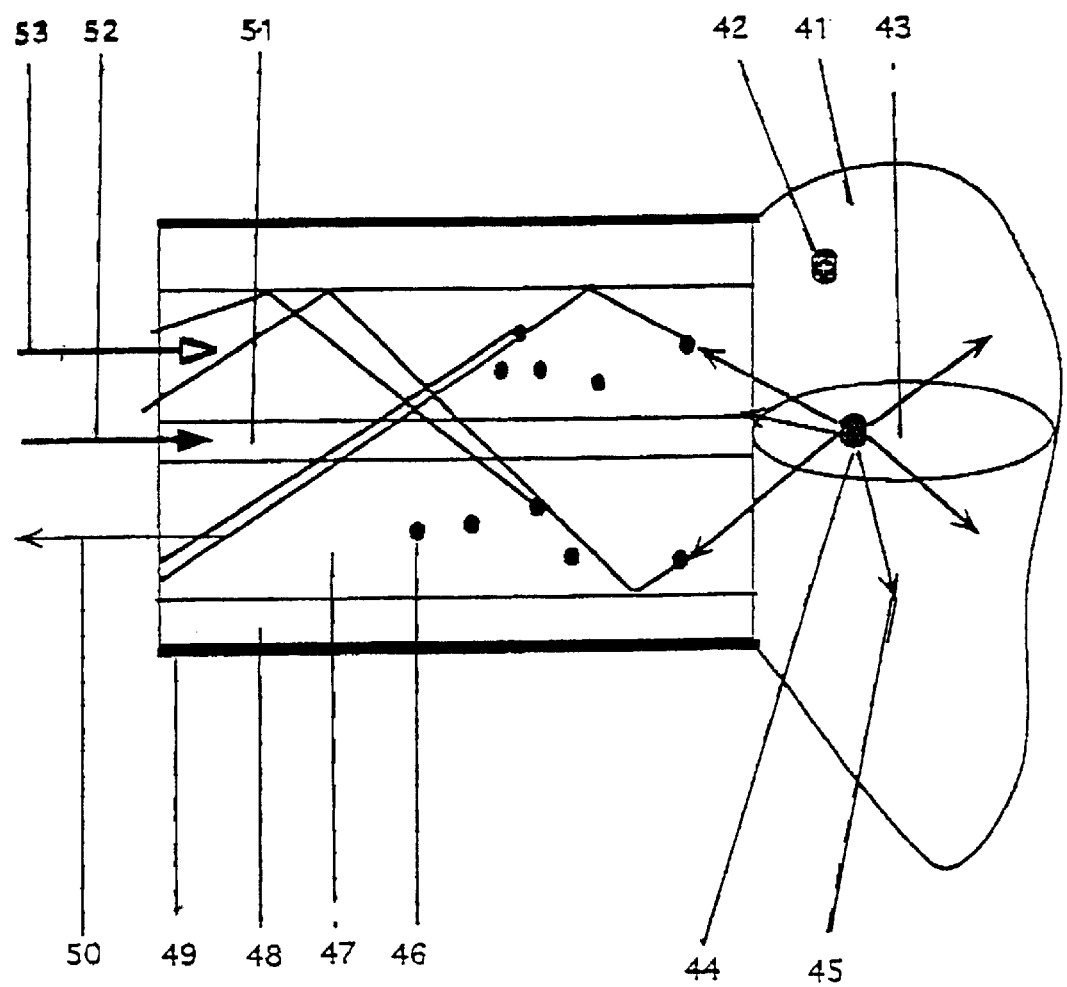
FIG. 6 is a special application of the detecting unit of the radiation detection device in accordance with the invention as a fluorescence sensor.

While FIGS. 1 through 5 showed detection devices for radiation, FIG. 6 shows an example of a biosensor for single molecule detection which makes it possible to detect small quantities of fluorescence-marked substances in fluids or in living organisms. Examples of fluorescence-marked substances can be medicines or macromolecules such as proteins. Moreover, fluorescence-marked cells, bacteria and viruses can be detected and quantified. Fluorescence light can be measured in fluids in vitro or in vivo in living organisms.

FIG. 6 shows an optical fiber that is characterized by a core 51 through which the light 52 is coupled for fluorescence excitation, but which does not serve as an optical amplifier section as previously described. The optical amplifier section here is located in the inner jacket section 47. The outer jacket section 48 and the inner jacket section 47 constitute the previously described optical waveguide. The outer layer 49 provides mechanical protection for the fiber, is opaque, and prevents the penetration of interfering light. In contrast to the previous examples 1–5, in which the photons were generated within the sensor section, the photons here are generated in the immediate vicinity of the sensor section. The sensor section serves to collect, amplify and transport the fluorescence light. One end of the fiber is located, for example, in a fluid (water, blood, organic solvent, etc. 41) or in a gel 41 or sol (e.g. cytosol of cells 41), in which are located the fluorescence-marked substances 42 that are to be detected. In medium 41, into which the fiber extends, a spatially defined light cone 43 is formed by the fluorescence excitation light 52. When fluorescence-marked substances 42 enter this light cone 43 through diffusion or convection, the fluorescence-marked substance 42 is brought into an excited state 44 and emits fluorescence light 45. A portion of the fluorescence light 45 enters the interior of the fluorescence sensor. The material of the inner jacket functions once again as an optical fiber amplifier, and is activated by pumping light 53. When a photon 45 now strikes an optically active center 46, the net result is optoelectronic avalanche amplification and the amplified fluorescence light 50 exits at the other end of the fiber. Optoelectronic conversion can preferably be accomplished with a PIN or avalanche diode.

What is claimed is:

1. A method for the detection of incident -radiation, comprising converting said incident radiation in a sensor section of an optical waveguide into a radiation output comprising photons in the UV, visible, or IR portions of the electromagnetic spectrum by interacting with a photon-emitting material included in a glassy material having crystal-like properties and a sufficient density to stop γ-radiation, and amplifying said radiation output in an optically pumped amplifier section of said optical waveguide, the amplifier section comprising a glassy material having crystal-like characteristics and a sufficient density to stop γ-radiation.

2. A method according to claim 1, wherein the amplifier section is optically pumped by pulsed light.

3. An optical waveguide device for the detection of incident radiation, comprising at least one detection element including (i) a sensor for converting the incident radiation into a radiation output comprising photons in the UV, visible, or IR portions of the electromagnetic spectrum, the sensor comprising a glassy material having crystal-like characteristics and a sufficient density to stop γ-radiation, the sensor further comprising a photon-emitting material; and (ii) an optical amplifier that receives said radiation output from the sensor section, amplifies the radiation output and transmits it for further processing, said optical amplifier comprising a glassy material having crystal-like characteristics and a sufficient density to stop γ-radiation that is at least partially optically pumped for amplification of said radiation output.

4. A device according to claim 3, wherein the glassy material having crystal-like characteristics and a sufficient density to stop γ-radiation is a heavy metal fluoride glass.

5. A device according to claim 3, wherein the photon-emitting material is at least one atom from the lanthanide group.

6. A device according to claim 4, wherein the glassy material having crystal-like characteristics and a sufficient density to stop γ-radiation of the optical amplifier includes at least one inorganic crystal component selected from the group consisting of BGO, CeF, $BaF_2$.

7. A device according to claim 3, wherein the incident radiation is selected from the group consisting of X-rays, β-radiation, gamma rays, ionizing radiation, fluorescence and low-level light.

8. A device according to claim 7, wherein said amplifier section is surrounded by said sensor.

9. A device according to claim 7, wherein a pumping light source is coupled to the core of the optical waveguide.

10. A device according to claim 8, wherein the optical waveguide device is combined with an instrument selected from the group consisting of a NMR device, a PET system, an X-ray imaging device, biosensor, and radioimmunoassay.

11. A device according to claim 3, wherein a pumping light source is coupled to the optical waveguide, said pumping light source generating at least one of (a) continuous pumping light, (b) pulsed pumping light, (c) one or more wavelengths of light, and (d) infrared light.

12. A device according to claim 3, wherein the optical waveguide comprises a columnar microstructure.

13. A device according to claim 3, wherein the optical waveguide comprises a planar waveguide.

14. A device according to claim 3, wherein the optical amplifier is coupled to an optoelectronic converter.

15. A device according to claim 3, wherein said sensor comprises wavelength shifters for photonic conversion of the radiation output to higher wavelength than would be generated in the absence of said wavelength shifters.

16. A device according to claim 3, wherein said sensor has an elongate shape for directional selection of incident γ-radiation.

17. A process to determine γ rays wherein the rays are transformed into photons in the UV, visible or IR range of the electromagnetic spectrum in a sensor in an optical waveguide, wherein the γ rays are transformed by the sensor into photons by interacting with a photon-emitting material included in a heavy metal fluoride glassy material, the photons are taken by an optically pumped amplifier component and transmitted in an amplified state, the amplifier component comprising a heavy metal fluoride glassy material.

18. A process according to claim 17 wherein the amplifier component is optically pumped with pulsed light.

19. An optical waveguide device to determine γ rays with at least one sensor and optical amplifier section, the amplifier section takes the light transformed by the sensor and transmits it to be further processed in an amplified state, the sensor comprises a heavy metal fluoride glassy material having a sufficient density to stop γ-radiation, the sensor further comprising a photon-emitting material to transform γ rays into photons in the UV, visible or IR range of the electromagnetic spectrum, and the amplifier section comprises a heavy metal fluoride glassy material having a sufficient density to stop γ-radiation.

20. A process to determine β-radiation wherein the β-radiation is transformed into photons in the UV, visible or IR range of the electromagnetic spectrum in a sensor of an optical waveguide, wherein the β-radiation is transformed by the sensor into photons by interacting with a photon-emitting material included in a non-silicate glassy material having crystal-like properties and a sufficient density to stop γ-radiation, the photons are taken by an optically pumped amplifier component that is also in the optical waveguide and transmitted in an amplified state, the amplifier component comprising a non-silicate glassy material having crystal-like characteristics and a sufficient density to stop γ-radiation.

21. A process according to claim 20 wherein the amplifier part is optically pumped by pulsed light.

22. A process according to claim 20 wherein a fluid that contains β-radiation at least partially circulates around the light guide.

23. A device to determine incident radiation with at least one sensor and optical amplifier, the optical amplifier takes the light transformed by the sensor and transmits it to be further processed and amplified, the sensor comprising a non-silicate glassy material having crystal-like characteristics and a sufficient density to stop γ-radiation, the sensor further comprising a photon-emitting material; and the optical amplifier comprising a non-silicate glassy material having crystal-like characteristics and a sufficient density to stop γ-radiation.

24. A device according to claim 23 wherein the light guide passes through a container with an inlet and an outlet for a fluid that circulates around the light guide and contains or can contain rays.

25. A process to detect fluorescent light where fluorescent light enters one end of the light guide in a sensor part that is in an optical light guide, and the light absorbed by the sensor part is transmitted in an amplified state in an optically pumped amplifier that is also in the optical light guide, the sensor comprising a glassy material having crystal-like characteristics and a sufficient density to stop γ-radiation, the sensor further comprising a photon-emitting material; and the optical amplifier comprising a glassy material having crystal-like characteristics and a sufficient density to stop γ-radiation.

26. A device according to claim 25, wherein light for fluorescence excitation is coupled into the optical light guide, and the light forms a spatially defined light cone at one end of the light guide.

27. A detector for detection of incident radiation, comprising a sensor comprising a glassy material having crystal-like characteristics and a sufficient density to stop γ-radiation and a photon-emitting material; and an optical amplifier comprising a glassy material having crystal-like caharacteristics and sufficient density to stopγ-radiation.

* * * * *